(12) United States Patent
Shieh et al.

(10) Patent No.: US 8,435,832 B2
(45) Date of Patent: May 7, 2013

(54) DOUBLE SELF-ALIGNED METAL OXIDE TFT

(75) Inventors: Chan-Long Shieh, Paradise Valley, AZ (US); Gang Yu, Santa Barbara, CA (US)

(73) Assignee: CBRITE Inc., Goleta, CA (US)

( * ) Notice: Subject to any disclaimer, the term of this patent is extended or adjusted under 35 U.S.C. 154(b) by 0 days.

(21) Appl. No.: 13/406,824

(22) Filed: Feb. 28, 2012

(65) Prior Publication Data

US 2012/0302003 A1   Nov. 29, 2012

Related U.S. Application Data

(63) Continuation-in-part of application No. 13/116,292, filed on May 26, 2011, now Pat. No. 8,129,720.

(51) Int. Cl.
  *H01L 21/00*   (2006.01)
(52) U.S. Cl.
  USPC ............... 438/104; 438/160; 257/E21.461
(58) Field of Classification Search ........... 438/159, 438/160, 970; 257/E21.461
  See application file for complete search history.

(56) References Cited

U.S. PATENT DOCUMENTS

| | | | | |
|---|---|---|---|---|
| 6,632,711 | B2 * | 10/2003 | Sugano et al. | 438/151 |
| 6,887,776 | B2 * | 5/2005 | Shang et al. | 438/612 |
| 7,960,735 | B2 * | 6/2011 | Jung et al. | 257/72 |

\* cited by examiner

*Primary Examiner* — Chandra Chaudhari
(74) *Attorney, Agent, or Firm* — Parsons & Goltry; Robert A. Parsons; Michael W. Goltry (57) ABSTRACT

A method of fabricating MOTFTs on transparent substrates includes positioning opaque gate metal on the front surface of a transparent substrate and depositing transparent gate dielectric, transparent metal oxide semiconductor material, and passivation material on the gate metal and the surrounding area. Portions of the passivation material are exposed from the rear surface of the substrate. Exposed portions are removed to define a channel area overlying the gate area. A relatively thick conductive metal material is selectively deposited on the exposed areas of the semiconductor material to form thick metal source/drain contacts. The selective deposition includes either plating or printing and processing a metal paste.

20 Claims, 4 Drawing Sheets

FIG. 7

DOUBLE SELF-ALIGNED METAL OXIDE TFT

FIELD OF THE INVENTION

This invention generally relates to a double self-alignment fabrication of metal oxide TFTs to remove critical alignment tools.

BACKGROUND OF THE INVENTION

Metal oxide thin film transistors (MOTFT) are gaining interest as high performance TFT backplanes for next generation display applications including active matrix liquid crystal displays, active matrix light emitting displays with organic light emitters (AM-OLED) or with inorganic crystalline light emitters (AM-LED). See for example the copending United States patent application entitled "Active Matrix Light Emitting Display" bearing Ser. No. 12/178,209, filed on 23 Jul. 2008, and incorporated herein by reference. Many of these large area applications use either glass or plastic substrates. To produce TFTs on large areas at low cost, it is advantageous to use low cost lithographic tools such as proximity/projection aligners rather than the more expensive stepper tools. Furthermore, due to deformation of substrates in processing (either glass due to high temperature treatment or plastic substrates due to chemical and heat treatment), the alignment issue has to be solved. Typically, misalignment due to deformation increases with the size of the exposure field. One way to compensate for the deformation is to reduce the exposure field by performing multiple exposures on the substrate and then stitching the multiple patterns together. However, this process substantially increases the manufacturing cost due to lower through put and the high cost of stitching.

It would be highly advantageous to have a self-aligned process in which there are no critical alignment steps.

Accordingly, it is an object of the present invention to provide new and improved methods of fabricating self-aligned metal oxide TFTs.

It is another object of the present invention to provide new and improved methods of fabricating metal oxide TFTs including no critical alignment tools or steps and using a minimum of process steps.

It is another object of the present invention to provide new and improved methods of fabricating metal oxide TFTs with metal source/drain contacts and buslines with improved thickness to wide ratio and with improved electric conductance.

It is another object of the present invention to provide new and improved methods of fabricating metal oxide TFTs with laser writing for patterning following layers after the $1^{st}$ metal layer. (Use $1^{st}$ photo mask to pattern critical structures as much as one can and self-align to fill in the rest.

It is also another object of the present invention to provide new and improved methods of fabricating metal oxide TFT arraies on a transparent substrate with low dimension stability in which only one high quality mask is used to define patterns on the first metal layer, and the critical patterns in the following layers are patterned by combinations of self-alignment with the first metal layer below, and additional patterning with low accuracy photolithography, laser writing or an add-on printing method.

SUMMARY OF THE INVENTION

Briefly, to achieve the desired objects of the instant invention in accordance with a preferred embodiment thereof, provided is a method of fabricating metal oxide TFTs on transparent substrates using double self-alignment steps. The method includes a step of providing a transparent substrate, either flexible or rigid, having a front surface and a rear surface, and positioning opaque gate metal on the front surface of the substrate to define a gate area for a TFT. A layer of transparent gate dielectric is deposited on the front surface of the substrate overlying the gate metal and a surrounding area and a layer of transparent metal oxide semiconductor material is deposited on the surface of the layer of transparent gate dielectric. Passivation material is then positioned on the layer of metal oxide semiconductor material by either a subtractive or an additive process to leave a passivation area defining a channel area for the TFT overlying the gate area. In the subtractive process some of the steps include depositing a layer of first positive working photoresist over the layer of a transparent passivation material overlying the gate metal and the surrounding area, exposing portions of the layer of first photoresist from the rear surface of the substrate and developing the layer of first photoresist to remove exposed portions of the layer of first photoresist to form an etch mask, and removing portions of the layer of passivation material and removing the etch mask. In the additive process the passivation layer is exposed directly, with exposed portions removed and unexposed portions remaining. A layer of transparent conductive material is then formed over the passivation area by one of subtractive and additive processes to leave source and drain areas on opposed sides of the channel area. The subtractive process includes the steps of depositing a layer of second negative working photoresist over the layer of transparent conductive material, exposing portions of the layer of second photoresist from the rear surface of the substrate and developing the layer of second photoresist to remove unexposed portions of the layer of second photoresist to form an etch mask, and removing portions of the layer of transparent conductive material by etching or the like. It will be understood that the transparent conductive material can include metal oxide, a thin layer of metal, etc. or in some special applications a transparent layer of organic material. The additive process includes selectively depositing the conductive material directly.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 4:
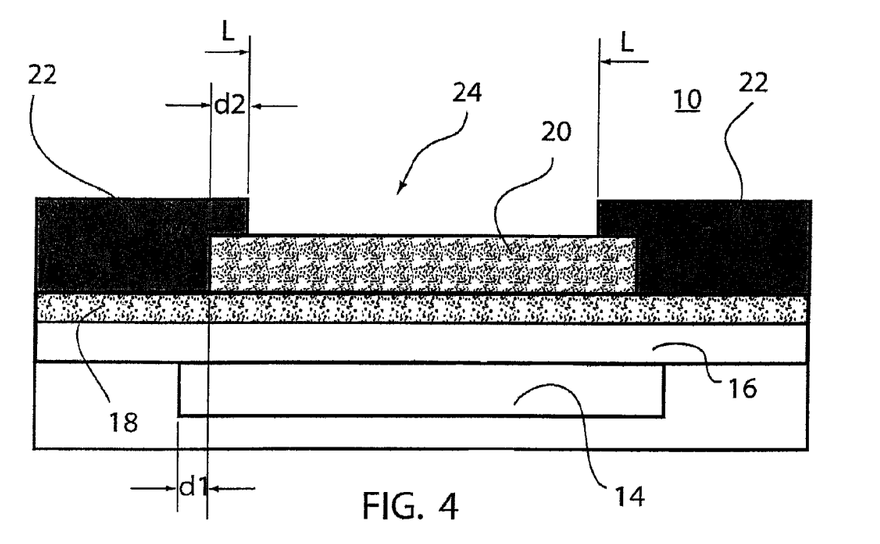
FIG. 4 illustrates an enlarged final stage or phase in the fabrication of TFTs in accordance with the present invention.

Turning now to the drawings, attention is first directed to FIG. 4, for the purpose of briefly explaining prior art problems. The device illustrated in FIG. 4 is a bottom gate and top source/drain metal oxide TFT, designated 10. TFT 10 includes a substrate 12 with gate metal 14 patterned thereon. A gate dielectric layer 16 is deposited over gate metal 14 and a semiconductor active layer 18 is deposited over dielectric layer 16 so as to insulate active layer 18 from gate metal 14. A passivation area 20 is patterned on active layer 18 and source/drain areas 22 are formed on opposite sides of passivation area 20 on the upper surface of active layer 18. The space between the source and drain defines the conduction channel, designated 24, for TFT 10.

In the prior art process of fabricating TFT 10, two critical alignment steps are prevalent. The first critical alignment step is between passivation area 20 (channel protection layer) and gate metal 14. Gate metal 14 should be slightly larger than passivation area 20, indicated as overlap area d1 where d1>0. The second critical alignment is between the pattern for source/drain 22 and passivation area 20. There should be a slight overlap between source/drain areas 22 and passivation area 20, indicated as overlap area d2 where d2>0, so that the etching of the source/drain conductor in the formation of source/drain areas 22 (i.e. the channel space between source/drain 22) will not affect active layer 18. That is the possibility that an etchant can pass around the edges of passivation area 20 and reach active layer 18 is prevented by overlap d2. It will be understood that any alignment patterning includes some tolerance and that the fabrication process includes some deformation tolerance.

Therefore to make a channel length of L (generally the horizontal width of passivation area 20), the distance between the source and drain should be smaller than (L−2×d2). In this relationship or description of L, d2 includes any alignment and deformation tolerance. Further, horizontal width of gate metal 14 should be larger than (L+2×d1). In this relationship or description of L, d1 includes any alignment and deformation tolerance. Thus, the value of overlaps d1 and d2 depends on the alignment tool (i.e. the alignment tolerance) and the amount of substrate deformation during the fabrication process. For low cost tools, overlaps d1 and d2 are relative large, around 5 microns without the added contribution from substrate deformation. For 10 ppm substrate deformation, a field size of 50 cm can contribute another 5 microns to the tolerance. It is desirable at present to fabricate TFTs with channel lengths as small, or smaller, than 10 microns. However, using the prior art fabrication methods described above with low cost tools and large field sizes, forming a channel length of 10 microns is not possible, or alternatively a source/drain spacing of 10 microns, will result in L equaling 30 microns because of the alignment/deformation tolerances included in overlaps d1 and d2.

Figure 1:
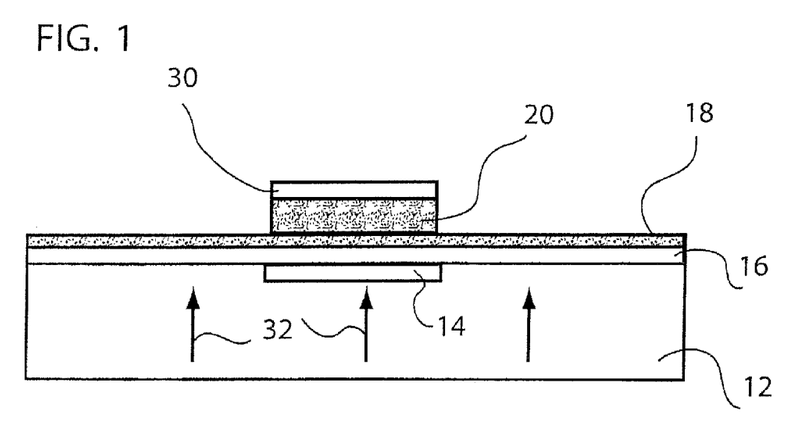
FIG. 1 illustrates a first stage or phase in the fabrication of TFTs in accordance with the present invention.

To understand the double self-alignment procedure of the present invention, FIGS. 1 through 4 illustrate sequential steps in an embodiment fabricated in accordance with the present invention. Turning specifically to FIG. 1, a transparent substrate 12 is illustrated, which may be any convenient material transparent to radiation (i.e. self-alignment exposure) wavelength used in the self-alignment procedure, such as glass, plastic, etc. Throughout this disclosure the terms "transparent" and "opaque" mean that the material being discussed or described is transparent or opaque to radiation (i.e. exposure) wavelengths used in the self-alignment procedure. Gate metal layer 14 is patterned on the upper surface of substrate 12 by any convenient means. Since the position of gate metal layer 14 is not critical virtually any non-critical patterning technique can be used. It will be understood by those of skill in the art that in addition to or instead of forming gate metal layer 14 with a proximity or a projection tool, the gate layer can be formed with any of the various printing processes mentioned above, including imprinting or off-set printing methods. Also, gate metal 14 is an opaque conductive metal that will not transmit the radiation wavelengths used in the self-alignment procedure. While a single gate metal 14 is illustrated for convenience in understanding, it will be understood that this might represent one or more (even all) of the TFTs used in a backplane or other large area applications.

A thin layer 16 of gate dielectric material is formed over gate metal 14 and the surrounding area. For purposes of this disclosure the term "surrounding area" includes at least the area illustrated in the figures (i.e. the gate and channel areas and the source/drain areas). Again, layer 16 may be a blanket layer covering the entire large area application and no alignment is required. The gate dielectric material may be any convenient material that provides the desired dielectric constant for TFT operation and is transparent to the radiation wavelengths used in the self-alignment procedure. Examples of the thin, transparent gate dielectric layer include SiN, SiO2, Al2O3, SrO, Ta2O5, V2O5, Nb2O5, HfO2, TiO2 in either single layer, multiple layer or blend forms. This layer can be formed with one of physical deposition means (such as sputter, laser deposition etc.) or one of a chemical deposition means (such as MOCVD, PECVD, Atomic layer deposition (ALD) etc.). A process without vacuum equipment can also be used including anodization or surface oxidation. In a preferred process on substrates with larger coefficient of thermal expansion (CTE), anodization stands out over other methods for film quality processed at room temperature.

A layer 18 of semiconductor metal oxide is deposited over the upper surface of layer 16. Metal oxide layer 18 is transparent to the radiation wavelengths used in the self-alignment procedure. Some typical examples of transparent metal oxides include ZnO, In2O3, SnO2, CdO, MgO, or their combinations such as AlZnO, ZnInO, InAlZnO, InAlSnO, InSiZnO, InSiSnO, InGaZnO, InSnO, ZnSnO, GaSnO, InGaSnO, InGaCuO, InCuO, AlCuO, InMgO, InCdO, InCdZnO, InMgZnO etc. As explained in the above described copending patent application, the metal oxide semiconductor may be amorphous or polycrystalline, however, amorphous or nanocrystalline films with grain size significantly smaller than the channel length is preferred. Layer 18 may be a blanket layer or it may optionally be patterned, depending primarily on the final product. Typical processes for forming the layer 18 include sputtering, laser deposition, ALD, and CVD. In addition the channel layer 18 can also be formed from organo-metallic solution comprising corresponding metals with a proper post-treatment to establish the property.

A passivation layer transparent to the radiation wavelengths used in the self-alignment procedure is then deposited over layer 18. Preferably, the constraint on the passivation layer is that the passivation layer should have very little chemical interaction with the underlying semiconductor metal oxide layer 18. For examples and explanations of this feature see the copending United States patent application entitled "Metal Oxide TFT with Improved Carrier Mobility", bearing Ser. No. 12/173,995, filed on 16 Jul. 2008, and incorporated herein by reference. Examples of passivation material that can be processed by a wet coating process (such as spin coating, slot coating, spray coating, etc.) or printing process include polymer PMGI, polystyrene, PMMA, polyimide, polyvinylene alcohol (PVA), polyethylene, polycarbonates, polysilane, BCB, spin on glass, and a class of cross-linkable polymer including epoxy resins. Examples of passivation material that can be processed by vacuum deposition (such as thermal evaporation, laser deposition, sputtering, MOCVD or PECVD) include $MgF_2$, MgO, $Ta_2O_5$ $V_2O_5HfO$, $W_2O_5$ SrO, $TiO_2$, $SrTiO_3$ $Al_2O_3SiO_2$, SiN etc. The passivation layer can be in the form of single layer, bi-layer, multiple layers or in a mixture/blend form.

Once the passivation layer is deposited, a positive working photoresist layer 30 is positioned thereon, for example by spin coating, slot coating, spray coating, or the like. Photoresist layer 30 is then exposed from the back (rear surface, below substrate 12 in FIG. 1, represented by arrows 32). Since all of the materials except the gate metal are transparent to the exposing light, gate metal 14 will act as a mask for the alignment of the passivation area 20. Thus, photoresist layer 30 is exposed and developed to form a mask for the etching of the passivation layer into passivation area 20 overlying gate metal 14. As illustrated in FIG. 1, all exposed portions of photoresist layer 30 are removed because the exposed portions of the positive photoresist decompose or disassociate (change relative to the unexposed portion) to allow the exposed areas to be relatively easily removed in the developing stage. The passivation material over the exposed areas can be etched away using the first photoresist as a mask, generally with a light etchant or other dissolving material, with no effect on the lower surface.

In an alternative process, the passivation layer can include a patternable material, such as the positive working photoresist, PMGI (MicroChem Co.), photopatternable polyimide or poly-acrylics (Toray SL-4100, Torey DL-1603, HD Microsystem PI-2500 series, etc.), positive tone photoresist developed by Zeon Corp. of Japan (ZWD6000 series and the like), insulating nano-particles embedded in the positive working photo polymer, etc. UV decomposable paintings known to experts in the painting industry can also be used for forming passivation layer 20. In this alternative process the passivation layer is exposed and developed so that only the passivation layer 20 remains overlying gate metal 14. It should be noted that in this specific process the passivation layer does not need to be transparent since the passivation layer is exposed rather than a photoresist layer on the upper surface.

The passivation layer 20 can also be a regular polymer known to package industry, such as PET, PEN, PAN, PI, PC, polyethylene etc. When such material is used, its patterning can be achieved with the patterned photoresist layer 30 (in FIG. 1) as the patterning mask and then by plasma etching under oxygen or other gas, a process known to device industry and printing circuit board industry.

Regardless which method or process for patterning passivation area 20 is used, the method should not destroy or adversely affect semiconductor active layer 18. Some extra mask pattern may be needed or used to pattern other parts of the product outside of TFT 10 and the critical gate area. A description of such parts of the product outside of TFT 10 is provided in a copending United States patent application entitled "Self-Aligned Transparent Metal Oxide TFT on Flexible Substrate", bearing Ser. No. 11/949,477, filed on 3 Dec. 2007, and incorporated herein by reference. The pattern in such non-critical areas can also be formed by one of several printing methods (such as imprinting, inkjet printing, solution dispensing, etc.) known to artisans in the printing field.

In yet another alternative process, passivation layer 20 over the gate area can be formed by changing surface properties of the substrate under UV exposure, and delivering the passivation material either uniformly or near the targeting patterning area 20 with one of coating (e.g. slot coating, dip coating, spray-coating, spin-coating, etc.) or printing (e.g. inkjet printing, screen printing, solution dispensing, laser-assisted thermal transfer printing etc.) methods known to the artisans in the field. The ink/solution then forms the pattern of area 20 under the surface force, after which the ink/solution is dried. For example, the surface is primed with an organic vapor having a hydrophobic nature, the surface is then illuminated with UV light from the substrate side as shown in FIG. 1 and the area exposed to UV light becomes hydrophilic. A layer of polystyrene film, for example, can be formed in area 20 by dipping the substrate in polystyrene solution or by coating (slot, spray coating) over the substrate. An additional air blow (blazing or knifing) can be used to help the patterning when the substrate is laid horizontally.

Figure 2:
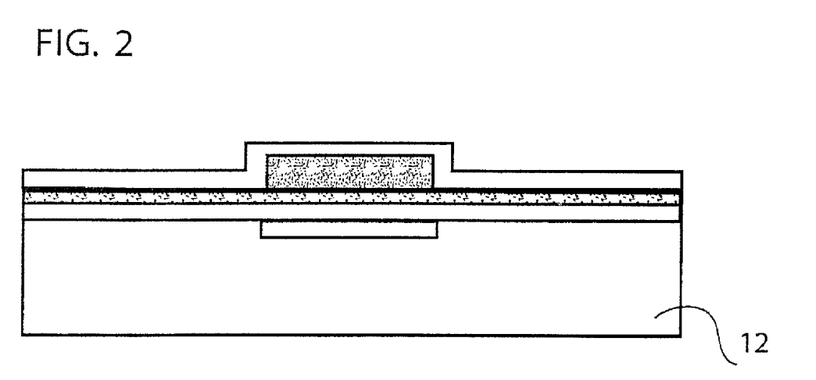
FIG. 2 illustrates a second stage or phase in the fabrication of TFTs in accordance with the present invention.
Figure 3:
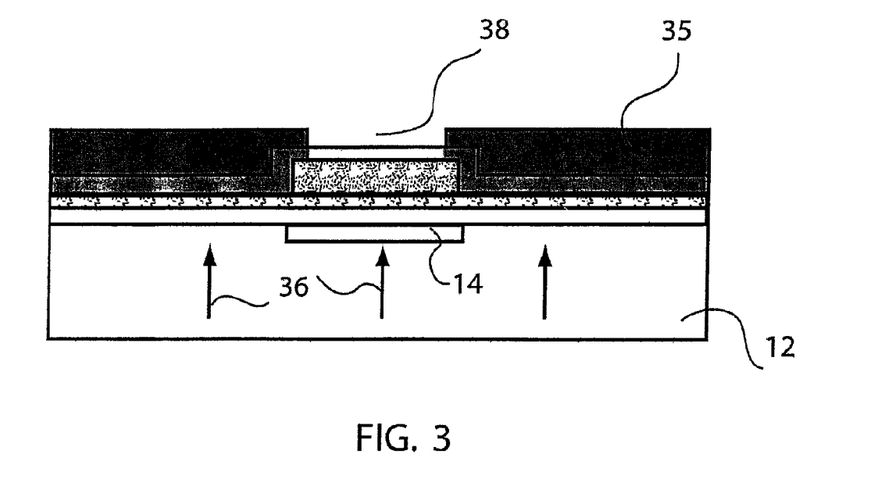
FIG. 3 illustrates a third stage or phase in the fabrication of TFTs in accordance with the present invention.

As illustrated specifically to FIG. 2, once the passivation layer is patterned or completed to produce passivation area 20, a layer of transparent conductive material, such as a transparent conductive metal oxide, a transparent thin layer of metal or metal alloys, etc. (or in some specific applications a layer of transparent organic material) is deposited on the upper surface of the device. The layer may be a blanket layer or some extra mask pattern (very rough and non-critical) may be needed to pattern other parts outside the TFT 10 area. The pattern in the non-critical outside areas can also be formed by delivering the photoresist to the corresponding area with one of the printing techniques (such as solution dispensing, inkjet printing, imprinting, off-set printing, screen printing, laser-assisted thermal transfer printing etc.) known to artisans in the field. As illustrated in FIG. 3, a layer of negative working photoresist, designated 35, is applied, preferably by some method such as spin coating, spray coating, slot coating, etc. (or one of the printing methods known to artisans in the field) to the upper surface of the layer of transparent conductive material.

Layer 35 of negative working photoresist is exposed from the back (below substrate 12 in FIG. 3, represented by arrows 36). Since all of the materials except gate metal 14 are transparent to the exposing light, gate metal 14 will act as a mask for the alignment of source/drain areas 22. Thus, photoresist layer 35 is exposed and developed to form a mask for the etching of the transparent conductive layer into source/drain areas 22. As illustrated in FIG. 3, a gap 38 is formed in photoresist layer 35 because the negative photoresist hardens when exposed (changes relative to the unexposed portion) and allows the unexposed areas to be removed in the developing stage.

It will be understood that the above described method of placing source/drain conductors using the negative or subtractive photoresist process can be performed in other ways. For example, another way of placing self-aligned source/drain conductors is by an additive process. In the additive process, instead of depositing a conductive layer and then patterning the layer through photolithography and an etch process to form source/drain conductors, the source/drain conductors can be selectively deposited through a photo-deposition process. In this process (hereinafter the "additive process"), the conductive material is deposited only on areas exposed to light (i.e. selective deposition). Some examples of an additive process include: Pt, Pd, Au deposition as described by Ceimig Limited; "Direct patterning ITO transparent conductive coatings", Qiang Wei et al., Chemat Technology Inc., conductive nanoparticles (such as Ag, carbon nanotube, etc.) embedded in negative working photo polymer matrix, and photopatternable conducting polymers which can be patterned similar to negative resist so that only the conductive material remains in the selected locations (e.g. source/drain areas). In the latter process, in some instances it may be desirable to remove some or all of the polymer from the matrix, for example through high heat (burn-off), to increase the conductivity. It should be noted that transparency of the conductive material is optional in the additive process because of the selective deposition even though the double self-alignment process is still incorporated.

The process for forming the source-drain electrodes, the gate dielectric layer and the gate layer can also be used concurrently for forming storage capacitors or contact pads in the pixel circuit in the matrix (array) area and in driving circuits in peripheral areas outside the active array. Such process provides a means of forming a thin film transistor array over large size substrates with poor dimension stability (for example, some type of thin glass, or plastic sheets). In addition to the transistor arrays, a plurality of narrow electric wires are often desired to be formed concurrently along with the source drain electrodes (often called data lines in TFT backplane). These buslines are perpendicular to the buslines in the gate layer. In addition to forming such data lines with a traditional photolithography process, such data lines can be formed with one of the printing or add-on processes mentioned above. Among them, two preferred embodiments are described in more detail below:

In the first embodiment, the source drain and the data buslines are formed with an add-on process on treated substrates of which the channel of the source-drain electrodes is defined by selective light illumination from the bottom to prime a hydrophilic surface into hydrophobic (assuming an organic solvent base conducting ink is used for S/D layer). The areas for thin data lines can be primed into hydrophobic with a laser beam (or an array of laser beams) scanning perpendicular to the gate line direction. Instead of a laser, a long and narrow UV beam can be formed with an optical wedge or any cylinder lens and scanned through the substrate in a corresponding direction. Adjusting the exposure time and duration along with scanning speed allows one to align the pitch with the source-drain electrodes and to form complete backpanels over large size substrates. After the laser exposure (surface priming), all the patterns on the source drain metal layer can be formed by dispensing the conductive ink onto the top source, similar to the process described for the passivation pattern 20 previously.

The second preferred embodiment is fabricated with a similar process. However, rather than priming the surface for S/D, one starts from the process described in FIG. 3. After depositing a partially transparent S/D layer, and coated with a layer of negative working photoresist, the channel area is exposed from the bottom of the substrate similar to the process described in conjunction with FIG. 3. The data lines are then formed by laser (or other light beam along with optic wedge or lens) scanning through the corresponding direction. All the conductive patterns on the source/drain layer can be formed after development and resistor stripping.

The two processes described above are of special usage for forming thin film circuits over large substrates with poor dimension stability. In addition to substrates in sheet form (either rigid or flexible), the entire TFT backpanel can be processed on a flexible substrate in roll-to-roll form, similar to the process flow used in fabricating flexible printing circuit boards.

Figure 5:
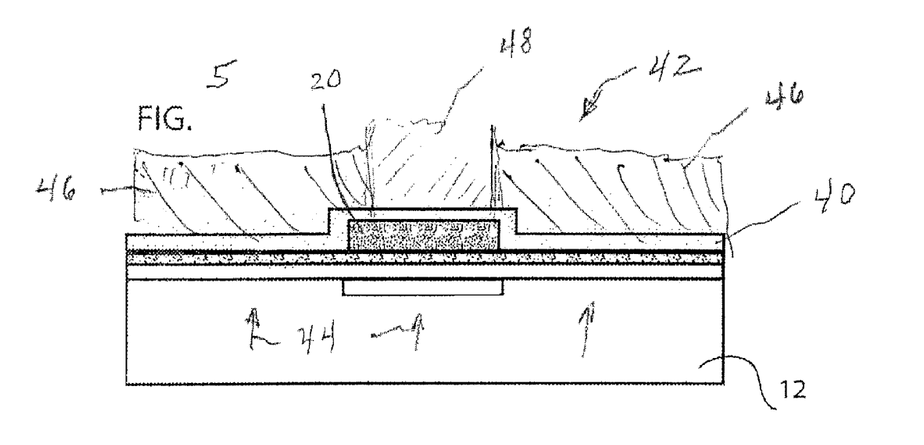
FIG. 5 illustrates a second stage or phase in an electronic circuit comprising the fabrication of double self-aligned TFTs with thick metal source/drain contacts in accordance with the present invention.
Figure 6:
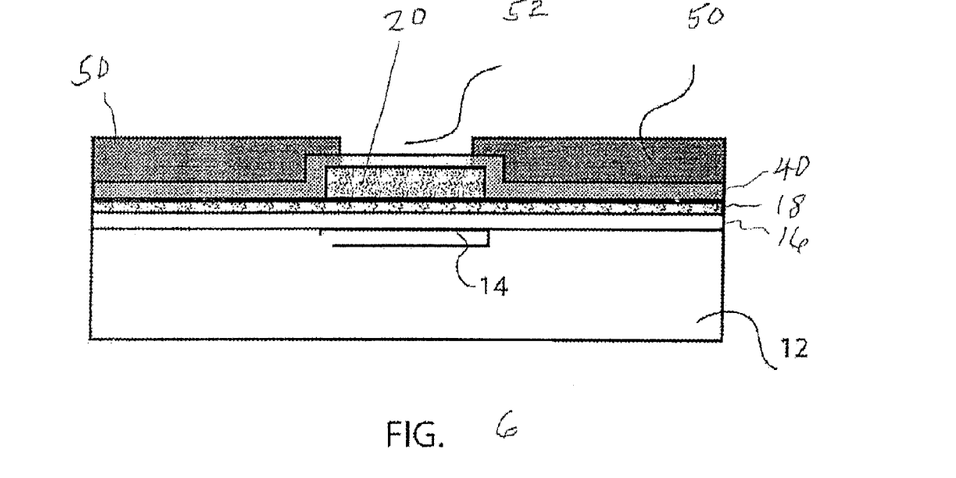
FIG. 6 illustrates a third stage or phase in the fabrication of TFTs with thick metal source/drain contacts in accordance with the present invention.
Figure 7:
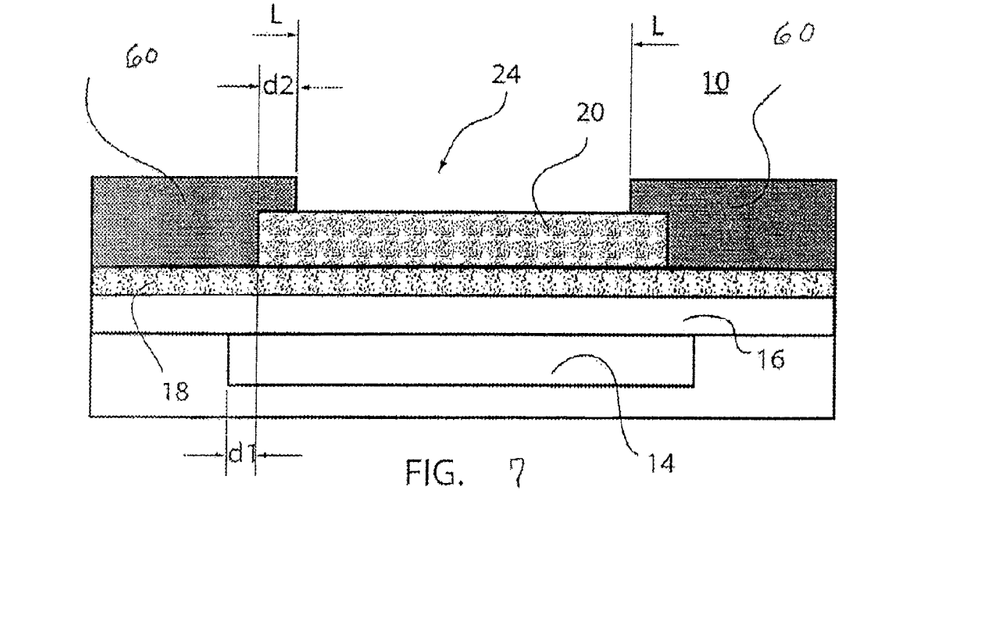
FIG. 7 illustrates an enlarged final stage or phase in the fabrication of TFTs with thick metal source/drain contacts in accordance with the present invention.

In yet another embodiment, it should be understood that the above described method of placing source/drain conductors using the additive process can be performed in other ways to provide thick highly conductive metal source/drain contacts. Referring to FIGS. 5-7 other methods of forming thick metal source/drain contacts in accordance with the present invention are illustrated.

In a first thick conductor method illustrated specifically in FIG. 5, once the passivation layer is patterned or completed to produce passivation area 20, a thin layer 40 of transparent conductive material, such as a transparent conductive metal oxide, a transparent thin layer of metal or metal alloys, etc. (or in some specific applications a layer of transparent organic material) is deposited on the upper surface of the device. Layer 40 may be a blanket layer or some extra mask pattern (very rough and non-critical) may be needed to pattern other parts outside the TFT 10 area. The pattern in the non-critical outside areas can also be formed by delivering the photoresist to the corresponding area with one of the printing techniques (such as solution dispensing, inkjet printing, imprinting, offset printing, screen printing, etc.) known to artisans in the field.

A layer, generally designated 42, of positive photo resist material is applied in a blanket layer over the thin layer 40 of transparent conductive material. Layer 42 of positive working photoresist can be applied by any of the well known methods such as spin coating, spray coating, slot coating, etc. (or one of the printing methods known to artisans in the field) to the upper surface of layer 40 of transparent conductive material. Layer 42 of positive working photoresist is exposed from the back (below substrate 12 in FIG. 2, represented by arrows 44). Since all of the materials except gate metal 14 are transparent to the exposing light, gate metal 14 will act as a mask for the alignment of source/drain areas. Thus, photoresist layer 42 is exposed and developed, which removes portion 46 above the source/drain areas exposing thin layer 40 of transparent conductive material and leaving a portion 48 to form a mask for further operations.

Referring additionally to FIG. 6, using the thin layer 40 of transparent conductive material as a seed layer, a thick layer of conductive material is plated in the source/drain areas to form highly conductive source/drain contacts 50. Typical plating material includes conductive metal such as Cu, Ni, Cr, and combinations thereof, etc. Because layer 40 is only used as a seed layer for the plating process, it can be very thin and does not even need to be continuous. Thus, a variety of only lightly conductive materials can be used, some examples of which are Pd, Pt, Au, SnO, In2O3, In-Tin-O, In—Zn—O etc. Further, the plating will be selective (i.e. only on the conductive material) and no plating will occur on portion 48. Thus, as illustrated in FIG. 3, a gap 52 is formed between contacts 50 overlying gate 14. As understood by the artisan, using the plating process to form contacts 50 the contacts can be formed much thicker and of a highly conductive material and thus the resistance can be substantially reduced. Once contacts 50 are formed to the desired thickness, the remaining portion of the positive working photoresist material overlying the channel area and the thin layer 40 of transparent conductive material overlying the channel area is removed by an convenient process, such as etching using contacts 50 as an etch mask. Since passivation area 20 is positioned below thin layer 40, removing thin layer 40 by etching will not affect semiconductor metal oxide layer 18. Further, no additional critical masking steps are included.

The S/D layer processed with the plating process above fits very well with display applications requiring the conduction of sufficient electric current over large areas. The plating method offers a means to grow electrode 50 and the corresponding data lines, or power lines with not only low resistance but also high thickness-to-width ratio, so that backpanels with large aperture ratios can be achieved.

In a second thick conductor method illustrated specifically in FIG. 7, once the passivation layer is patterned or completed to define passivation area 20, a conductive material, such as conductive paste material, silver paste, carbon black paste, carbon nanotube paste, or the like, can be applied directly to the upper surface of semiconductor metal oxide layer 18. Portions of the positive resist material remaining in passivation area 20 can be treated with a material, such as $CF_4$ plasma, to make it hydrophobic so that the conductive paste will stick to it. Thus, using an application process, such as printing, dipping, etc. the conductive paste, designated 60 in FIG. 7, is applied only to the source/drain contact areas. As is understood in the art, the conductive paste is then processed, e.g. heated, to drive off or remove the solvent or other material forming the conductor into a paste. After the heating step, a thick layer of highly conductive material remains. Using this process the contacts can be formed much thicker and of a highly conductive material and thus the resistance can be substantially reduced. Further, no additional critical masking steps are included.

The thick metal contacts described as being selectively deposited above can be conveniently used or incorporated into a wide variety of electronic devices and circuits including thin film OLED and LCD circuits, thin film driving circuits, active matrix LED, OLED or LCD displays, imaging array devices, biosensor arrays and thin film readout devices. At least some of these devices and circuits are disclosed in the following United States copending patent applications: Amoled with Cascaded OLED Structures, Ser. No. 12/542,599, filed 17 Aug. 2009; Mask Level Reduction for MOFET, Ser. No. 12/612,123, filed 4 Nov. 2009; Metal Oxide TFT with Improved Stability, Ser. No. 12/915,712, filed 29 Oct. 2010; Improved Active Matrix for Displays and Method of Fabrication, Ser. No. 13/006,799, filed 14 Jan. 2011; Driving Method for Improving Stability in MOTFETs, Ser. No. 13/034,458, filed 24 Feb. 2011; and Metal Oxide TFT with Improved Source/Drain Contacts, Ser. No. 13/155,749, filed 8 Jun. 2011, all of which are incorporated herein by reference.

The process for the source-drain electrodes, the gate dielectric layer and the gate layer can also be used concurrently for forming a capacitor or a contact pad in the pixel circuit in the matrix (array) area and in driving circuits in peripheral areas outside the active array. The process can also be used for forming buslines wiring pixels together and connecting the pixels to peripheral electronic circuits outside the array area.

Integrated scan drivers and data drivers can also be made with the present TFT process. The process disclosed in this invention can thus be used generally to fabricate thin-film electronic circuits, examples include backpanel circuits for active matrix liquid crystalline displays, active matrix light emitting displays with emitting element formed with either organic or inorganic light emitters, active matrix image arrays, active matrix biosensor arrays, and active addressed touch panel arrays etc.

It will be understood that substantially complete control is possible for the size of overlaps d1 and d2 during the masking and etching stages without requiring additional steps or materials. For example, referring to the first masking step illustrated in FIG. 1, by changing the exposure time or intensity (e.g. increasing or decreasing either one) the amount of remaining photoresist can be decreased or increased, thus altering the width of overlap d1. Similarly, referring to the second masking step illustrated in FIG. 3, by changing the exposure time or intensity (e.g. increasing or decreasing either one) the amount of remaining photoresist can be increased or decreased, thus altering the width of overlap d2. Also, the etch used in conjunction with either of the patterns in FIGS. 1 and 3 can be increased to increase overlap d1 and/or decreased overlap d2. These features and how to adjust them are well known in the self-alignment field and are included in the term 'self-align" or "self-alignment" when used to describe the process.

It can be seen that no critical masking step is performed in which expensive tools are required. Also, because of the substantially complete control of the overlap or critical areas, any overlap can be provided from substantially zero to any desired amount without the necessity of sacrificing small channel lengths. Further, no expensive masks or tools are required and larger areas can be exposed during the process so that expensive stepping and stitching or the like are not required. Thus, a novel double self-alignment procedure has been disclosed for forming Double Self-Aligned Metal Oxide TFTs and additional components on transparent substrates.

Although the double-self-aligned process was described in a so-called bottom-gate, top-source/drain structure, the principle can also be used for other TFT structures including so-called bottom source/drain, top gate TFT structures. In this process, the source/drain electrodes are formed on the transparent substrate first, the transparent metal-oxide channel layer is formed by a self aligned method over the gap, a non-patterned transparent gate layer is formed over the TFT area, and a transparent or semitransparent gate metal is then formed over the gap area with the process similar to that for layer 22 in FIG. 4. When an add-on process is used, non-transparent gate materials can be used.

The self-aligned process disclosed in this invention reduces demands on substrate dimension stability. It is not only suitable for substrates made of rigid glass/plastic plates, but also thin glass or plastic foils in flexible or conformable forms. It allows thin film circuits with small dimension MOTFTs being made with a transparent substrate with poor dimension stability during heating, process condition changes such as vacuum pumping down or air/moisture exposure. The critical dimension of the MOTFT is determined by the double-self-aligned process disclosed in this invention with the patterns in subsequent layers above the first opaque metal layer being patterned with the built-in first metal layer.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of fabricating metal oxide TFTs on transparent substrates comprising the steps of:
providing a transparent substrate having a front surface and a rear surface;
positioning opaque gate metal on the front surface of the substrate to define a gate area for a TFT;
depositing a layer of transparent gate dielectric on the front surface of the substrate overlying the gate metal and a surrounding area and a layer of transparent metal oxide semiconductor material on the surface of the layer of transparent gate dielectric;
depositing a layer of passivation material on the layer of metal oxide semiconductor material;

exposing portions of the layer of passivation material from the rear surface of the substrate and removing exposed portions of the layer of passivation material to leave a passivation area defining a channel area for the TFT overlying the gate area;

depositing a seed layer of thin conductive material on the layer of metal oxide semiconductor material;

depositing a layer of positive working photo resist material on the seed layer;

exposing portions of the layer of positive working photo resist material from the rear surface of the substrate and removing exposed portions of the layer of positive working photo resist material to leave a portion of the positive working photo resist material overlying the channel area and leaving exposed areas of the seed layer defining source/drain areas for the TFT;

plating a relatively thick layer of conductive metal on the exposed areas of the seed layer; and using the layer of conductive metal, removing the portion of the positive working photo resist material and the seed layer overlying the channel area.

2. A method as claimed in claim 1 wherein the step of plating the conductive metal includes plating one of Cu, Ni, Cr, and combinations thereof.

3. A method as claimed in claim 2 wherein the step of depositing the passivation layer includes depositing and processing a patternable material as the layer of passivation material.

4. A method as claimed in claim 1 wherein the step of depositing the seed layer of thin transparent conductive material includes depositing one of a transparent conductive metal oxide, a transparent layer of thin metal, and a transparent organic layer.

5. A method as claimed in claim 4 wherein the step of depositing the seed layer includes depositing one of Pt, Pd, and Au.

6. A method as claimed in claim 1 including a step of incorporating the metal oxide TFTs into one of electronic devices and circuits including thin film OLED and LCD circuits, thin film driving circuits, active matrix LED, OLED and LCD displays, imaging array devices and thin film readout devices.

7. A method of fabricating metal oxide TFTs on transparent substrates comprising the steps of:

providing a transparent substrate having a front surface and a rear surface;

positioning opaque gate metal on the front surface of the substrate to define a gate area for a TFT;

depositing a layer of transparent gate dielectric on the front surface of the substrate overlying the gate metal and a surrounding area and a layer of transparent metal oxide semiconductor material on the surface of the layer of transparent gate dielectric;

depositing a layer of passivation material on the layer of metal oxide semiconductor material;

exposing portions of the layer of passivation material from the rear surface of the substrate and removing exposed portions of the layer of passivation material to leave a passivation area defining a channel area for the TFT overlying the gate area and leaving exposed areas of the metal oxide semiconductor material defining source/drain areas for the TFT;

depositing a relatively thick layer of conductive metal material on the exposed areas of the layer of metal oxide semiconductor material; and processing the layer of conductive metal material to provide thick metal source/drain contacts in communication with the metal oxide semiconductor material in the source/drain areas.

8. A method as claimed in claim 7 wherein the layer of passivation material is positive photoresist.

9. A method as claimed in claim 7 wherein the step of depositing a relatively thick layer of conductive metal material includes printing, dipping, or coating.

10. A method as claimed in claim 9 wherein the step of depositing a relatively thick layer of conductive metal material includes depositing a conductive paste.

11. A method as claimed in claim 10 wherein the step of depositing the layer of conductive paste includes depositing silver paste, carbon black paste, or carbon nanotube paste.

12. A method as claimed in claim 10 wherein the step of processing the layer of conductive metal material includes heating the conductive paste to remove solvents or organic groups.

13. A method as claimed in claim 7 including a step of incorporating the metal oxide TFTs into one of electronic devices and circuits including thin film OLED and LCD circuits, thin film driving circuits, active matrix LED, OLED and LCD displays, imaging array devices and thin film readout devices.

14. A method of fabricating metal oxide TFTs on transparent substrates comprising the steps of:

providing a transparent substrate having a front surface and a rear surface;

positioning opaque gate metal on the front surface of the substrate to define a gate area for a TFT;

depositing a layer of transparent gate dielectric on the front surface of the substrate overlying the gate metal and a surrounding area and a layer of transparent metal oxide semiconductor material on the surface of the layer of transparent gate dielectric overlying the gate metal and the surrounding area;

depositing a layer of passivation material on the layer of metal oxide semiconductor material overlying the gate metal and the surrounding area;

exposing portions of the layer of passivation material from the rear surface of the substrate and removing exposed portions of the layer of passivation material to leave a passivation area defining a channel area for the TFT overlying the gate area and source/drain areas for the TFT on either side of the channel area; and selectively depositing a relatively thick layer of conductive metal material on the exposed areas of the layer of metal oxide semiconductor material.

15. A method as claimed in claim 14 wherein the step of selectively depositing the relatively thick layer of conductive metal material includes the steps of providing a seed layer of thin conductive material and plating a conductive metal on the seed layer.

16. A method as claimed in claim 14 wherein the step of selectively depositing the relatively thick layer of conductive metal material includes the steps of depositing a metal paste material on the exposed areas of the layer of metal oxide semiconductor material and processing the metal paste material to provide thick metal source/drain contacts in communication with the metal oxide semiconductor material in the source/drain areas.

17. A method as claimed in claim 14 including a step of incorporating the metal oxide TFTs into one of electronic devices and circuits including thin film OLED and LCD circuits, thin film driving circuits, active matrix LED, OLED and LCD displays, imaging array devices and thin film read-out devices.

18. A method as claimed in claim 14 wherein the step of exposing portions of the layer of passivation material includes one of laser scanning and shaped light scanning.

19. A method as claimed in claim 18 wherein the step of exposing portions of the layer of passivation material uses laser scanning and includes tuning laser pulse time and duration to align with substrate dimension changes, thereby allowing the use of a thin organic flexible substrate.

20. A method as claimed in claim 14 wherein the steps of exposing portions of the layer of passivation material and selectively depositing a relatively thick layer of conductive metal material include forming buslines and other circuitry in the relatively thick layer of conductive metal material.

* * * * *